United States Patent [19]

Sakuta et al.

[11] Patent Number: 5,742,101
[45] Date of Patent: *Apr. 21, 1998

[54] SEMICONDUCTOR DEVICE

[75] Inventors: Toshiyuki Sakuta, Hamura-machi; Kazuyuki Miyazawa, Iruma; Satoshi Oguchi, Ohme; Aizo Kaneda, Yokohama; Masao Mitani, Yokohama; Shozo Nakamura, Yokohama; Kunihiko Nishi, Kokubunji; Gen Murakami, Machida, all of Japan

[73] Assignee: Hitachi, Ltd., Tokyo, Japan

[*] Notice: The term of this patent shall not extend beyond the expiration date of Pat. No. 5,365,113.

[21] Appl. No.: 458,166

[22] Filed: Jun. 2, 1995

Related U.S. Application Data

[62] Division of Ser. No. 329,824, Oct. 27, 1994, Pat. No. 5,514,905, which is a division of Ser. No. 000,125, Jan. 4, 1993, Pat. No. 5,365,113, which is a continuation of Ser. No. 640,584, Jan. 14, 1991, Pat. No. 5,184,208, which is a continuation of Ser. No. 212,485, Jun. 28, 1988, abandoned.

[30] Foreign Application Priority Data

Jun. 30, 1987 [JP] Japan ................. 62-161333
Sep. 17, 1987 [JP] Japan ................. 62-234654

[51] Int. Cl.⁶ ............... H01L 23/48; H01L 29/46; H01L 23/02
[52] U.S. Cl. ............... 257/786; 257/787; 257/692
[58] Field of Search ............... 257/787, 788, 257/786, 692, 666

[56] References Cited

U.S. PATENT DOCUMENTS

| | | | |
|---|---|---|---|
| 4,575,748 | 3/1986 | Terai, et al. | 357/74 |
| 4,612,564 | 9/1986 | Moyer | 357/70 |
| 4,630,095 | 12/1986 | Otsuka, et al. | 357/78 |
| 4,796,078 | 1/1989 | Phelps, Jr. et al. | 357/68 |
| 4,862,245 | 8/1989 | Pashby et al. | 357/70 |
| 4,934,820 | 6/1990 | Takahashi et al. | 357/70 |

FOREIGN PATENT DOCUMENTS

| | | | |
|---|---|---|---|
| 54-2683 | 1/1979 | Japan | 357/65 |
| 54-2683 | 1/1979 | Japan | 357/65 |
| 59-92556 | of 1984 | Japan | . |
| 60-167454 | of 1985 | Japan | . |
| 60-899955 | 5/1985 | Japan | 357/45 |
| 61-97854 | 5/1986 | Japan | 257/246 |
| 61-218139 | 9/1986 | Japan | 357/296 |
| 61-241949 | 10/1986 | Japan | . |
| 61-236130 | 11/1986 | Japan | 257/246 |
| 62-147763 | 7/1987 | Japan | 357/45 |

OTHER PUBLICATIONS

ISSCC '86, pp. 260–261 and 365; pp. 274–275 and 371 (Digest of Technical Papers).

Primary Examiner—Donald Monin
Attorney, Agent, or Firm—Antonelli, Terry, Stout, & Kraus, LLP

[57] ABSTRACT

A semiconductor device is provided in connection with a semiconductor chip which has a plurality of bonding pads at a part corresponding to a centrally located area of the front or first main surface thereof, an organic insulator film which overlies the semiconductor chip and which has an opening in correspondence with the bonding pads, a plurality of leads which overly the organic insulator film, and a molding resin with which these constituents are sealed or packaged.

25 Claims, 5 Drawing Sheets

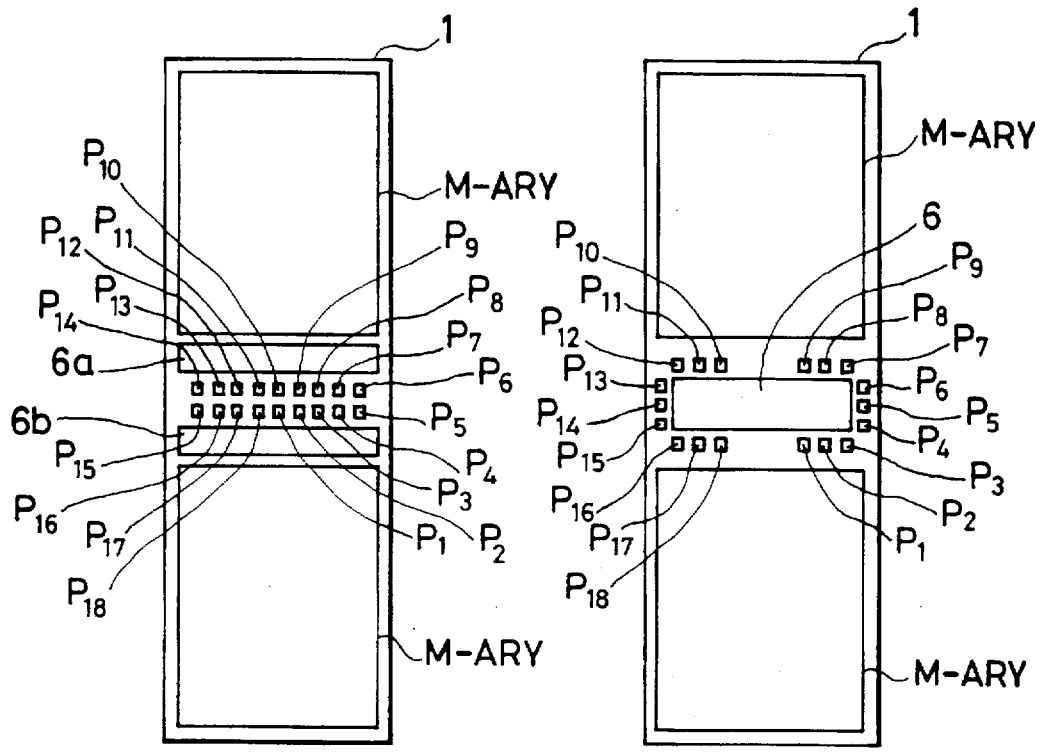
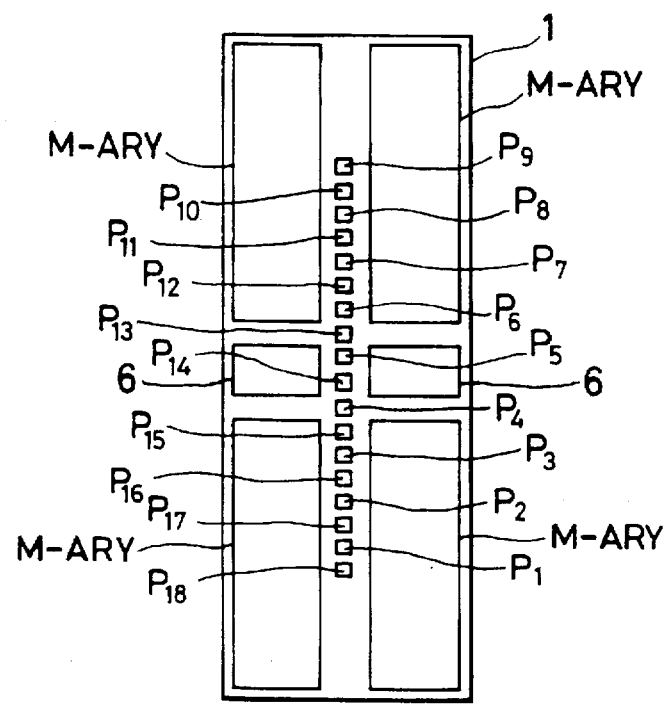

SEMICONDUCTOR DEVICE

This is a divisional of application Ser. No. 08/329,824, filed Oct. 27, 1994; now U.S. Pat. No. 5,514,905; which is a divisional of application Ser. No. 08/000,125, filed Jan. 4, 1993, now U.S. Pat. No. 5,365,113; which is a continuation of application Ser. No. 07/640,584, filed Jan. 14, 1991, now U.S. Pat. No. 5,184,208; and which, in turn, is a continuation of application Ser. No. 07/212,485, filed Jun. 28, 1988, now abandoned.

BACKGROUND OF THE INVENTION

The present invention relates to a semiconductor device, and more particularly to a resin-encapsulated semiconductor device having a chip structure and a package structure which are well suited for installing an oblong-shaped LSI chip of large size, such as, of an elongated rectangular shape, for example, in a small-sized package.

Heretofore, a method of installing an LSI chip in a plastic package has relied on a structure wherein a tab for placing the chip thereon is arranged at the central part of the package, the chip with bonding pad portions arranged at the four lateral sides thereof is bonded and mounted on the tab by the use of a conductive paste, the tip end parts of the leads of a lead frame are arranged along the four lateral sides of the chip, the pad portions and the tip end parts of the leads are interconnected by gold wire pieces, and the resulting assembly is molded with a resin.

With this type of structure, however, the distances between the chip and the tip end parts of the leads must be set far enough so as to allow connection of the gold wire pieces and, as a result thereof, the distance from the outer end of the chip to the outer end part of the package is lengthened, so that the accommodation of a large chip in a small package has become subject to geometrical restrictions. Further, the lengths of the leads buried in the package are small, and inner leads and the resin separate at the boundaries thereof due to mechanical stresses arising during the step of bending the outer leads, so that especially in the direction of the shorter lateral sides of the chip, the pair of short sides of the package have been inevitably designed to be long.

Moreover, since the tab equal in area to the chip is arranged centrally in the package, the peeling of the resin near the boundary and under the chip, attributed to a thermal stress, and resulting cracks of the resin extending toward positions below the tab are often incurred. Therefore, the above type of structure could no longer be said to be an appropriate structure which produces satisfactory results in a temperature cycle and during a reflow-proof test.

In order to cope with the problems stated above, a wire bonding structure or a so-called tabless package of the chip-on-lead type has been proposed wherein as disclosed in Japanese Patent Application Laid-open No. 167454/1985, Japanese Patent Application Laid-open No. 218139/1986 and U.S. Pat. No. 4,612,564, the tip ends of the leads of a lead frame which does not require a tab are all arranged on the shorter lateral sides of a chip, an insulator film is adhered on the leads with a binder, the chip is fixed onto the film by die bonding, and the bonding pad portions of the chip and the tip end parts of the leads are interconnected by gold wire pieces.

Further, in order to cope with similar problems, a wire bonding structure or a so-called tabless package of the lead-on-chip type has been proposed wherein as disclosed in Japanese Patent Application Laid-open No. 92556/1984 and Japanese Patent Application Laid-open No. 236130/1986, leads are bonded onto a chip with a binder, and the bonding pads of the chip and the tip end parts of the leads overlying the chip are interconnected with pieces of gold wire or the like.

SUMMARY OF THE INVENTION

The inventors' studies have revealed that the following problems are involved in the prior art techniques mentioned above:

In the semiconductor device of the tabless package of the chip-on-lead type, the bonding pad portions of the chip on the insulator film and the tip end parts of inner leads are connected by the wire bonding. Therefore, the tip end parts of the leads, i.e. the front end portions of the inner lead parts of the leads, need to be designed longer than the longer lateral sides of the chip in correspondence with distances for the wire bonding, and the distance between the end part of the longer sides of the chip and that of the corresponding longer sides of the package need to be designed extensively long lest the bonding wire should be deformed to touch the end part of the chip in a resin-molding operation. Therefore, it cannot be said that the structure is really suited to install a large chip in a small package.

Moreover, in the semiconductor devices of the tabless packages of both the types, in a case where the bonding pads of the chip are located at the outer end parts of the chip, the connected parts of the bonding pads and the wire pieces undergo shearing stresses and are liable to break as a result of fatigue from thermal stresses which arise due to the difference of the coefficients of expansion of the semiconductor chip and a resin when the semiconductor device which is molded with the resin at a high temperature reverts to the normal temperature these thermal stresses are greater in the end parts of the chip than in the central part thereof.

In each of memories, for example, a dynamic RAM (Random Access Memory), a static RAM and a ROM (Read Only Memory), peripheral circuits other than a memory cell portion are provided at both the end parts of a chip. Therefore, in the case where the bonding pads on the chip are located at the outer end parts of the chip, wiring required for connecting the peripheral circuits at both the end parts of the chip becomes long, and the RC delay of a signal, to be transmitted through the wiring, ascribable to a wiring resistance R and a wiring capacitance C is great.

Further, in the semiconductor device of the lead-on-chip type, in a case where the bonding pads are provided on the inner sides of the chip, an inorganic passivation film protects the underlying surface against chip cracks during the operation or progress of bonding the wire pieces to the leads.

An object of the present invention is to provide a technique which can reduce the size of a semiconductor device.

Another object of the present invention is to provide a technique which can prevent the bonded parts of bonding pads and wire pieces from being broken or disconnected by stresses ascribable to a resin.

Another object of the present invention is to provide a technique which can prevent the delay of a signal attributed to long wiring.

Another object of the present invention is to prevent cracks from appearing in the passivation film of a semiconductor chip.

Typical aspects of performance and structural features of the present invention are briefly summarized as follows:

A semiconductor device is characterized in that bonding pads are provided substantially centrally on a semiconductor chip, that the front or first main surface of the semiconductor chip formed with the pads and the rear surfaces of the leads of a lead frame are bonded and fixed through an organic insulator film by the use of an insulating binder, that the bonding pads and the front or exposed upper surfaces of the fore end parts of each of the inner leads arranged on the front surface side of the chip are thereafter connected by wire bonding, and that the resultant structure is sealed with a molding resin.

Moreover, a semiconductor device in accordance with the present invention is characterized such that bonding pads and peripheral circuits are provided substantially centrally of a semiconductor chip, that the front first main or upper surface of the semiconductor chip formed with the pads and the rear surfaces of the leads of a lead frame are bonded and fixed through an organic insulator film by the use of an insulating binder, that the bonding pads and the fore or front end parts of inner leads are connected by wire pieces, and that the inner leads, the semiconductor chip and the wire pieces are sealed with a molding resin.

The above and other objects and novel features of the present invention will become apparent from the description of this specification and the accompanying drawings.

BRIEF DESCRIPTION OF THE DRAWINGS

FIGS. 10 thru 12 are plan views each showing a modified embodiment of the present invention.

DESCRIPTION OF THE PREFERRED EMBODIMENTS

Figure 1:
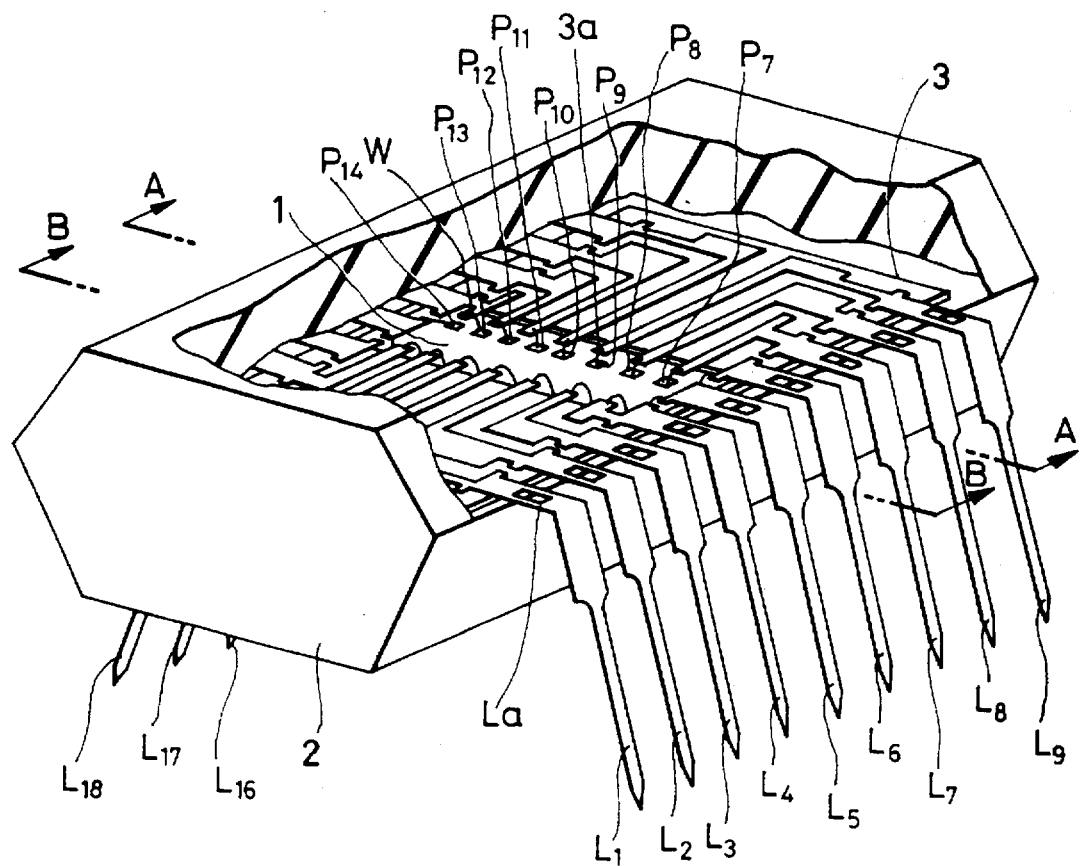
FIG. 1 is a perspective view showing the general construction of a resin-molding DIP package according to an embodiment of the present invention.
Figure 2:
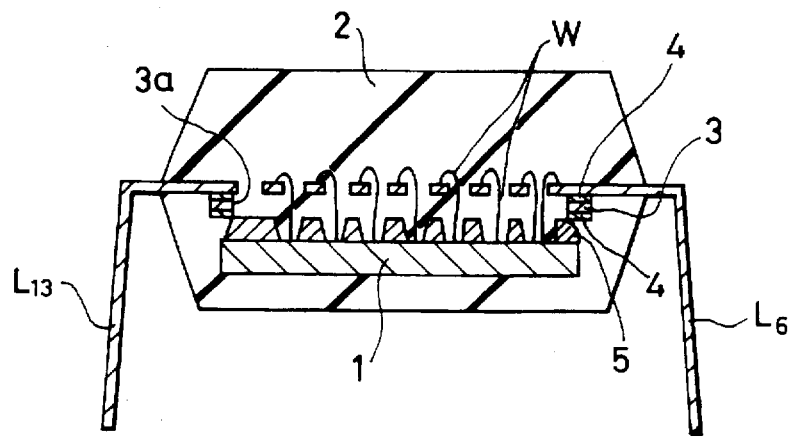
FIGS. 2 and 3 are sectional views taken along line A—A and line B—B in FIG. 1, respectively.
Figure 3:
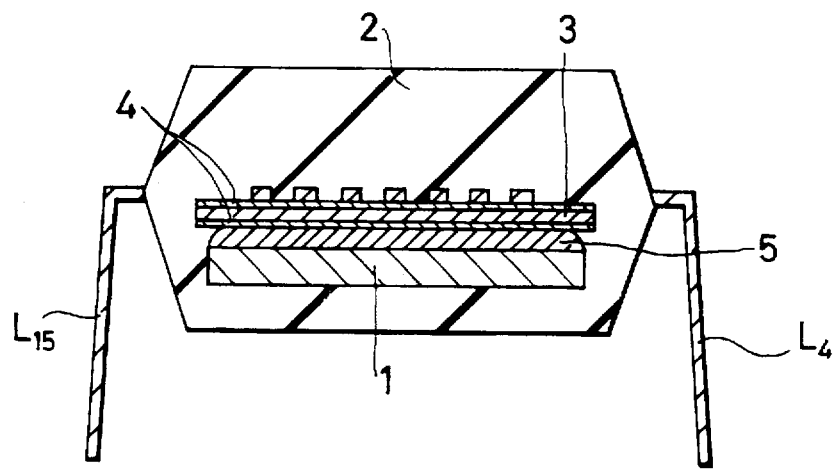

As illustrated in FIGS. 1-4, in a resin-molding DIP package according to this embodiment, a semiconductor chip, for example, silicon chip 1 which constitutes a dynamic RAM of 4 megabits by way of example is molded with a resin 2. Symbols $L_1$-$L_{18}$ denote leads, and these leads $L_1$-$L_{18}$ and bonding pads $P_1$-$P_{18}$ with which the semiconductor chip 1 is provided are respectively bonded by pieces of wire W. The leads $L_1$-$L_{18}$ are formed using a tabless lead frame LF shown in FIG. 6. In addition, numeral 3 indicates an organic insulator film, for example, polyimide resin sheet which is slightly larger in area than the semiconductor chip 1 by way of example and which is centrally provided with an opening 3a. The polyimide resin sheet 3 is bonded to the leads $L_1$-$L_{18}$ by a binder layer 4 which is made of, for example, a polyimide-based resin (FIGS. 2 and 3). This polyimide resin sheet 3 and a passivation film 5 made of an inorganic insulator film which is provided on the front or first main surface of the semiconductor chip 1 formed with the elements thereof are bonded by a binder layer 4 which is similar to the above.

Figure 5:
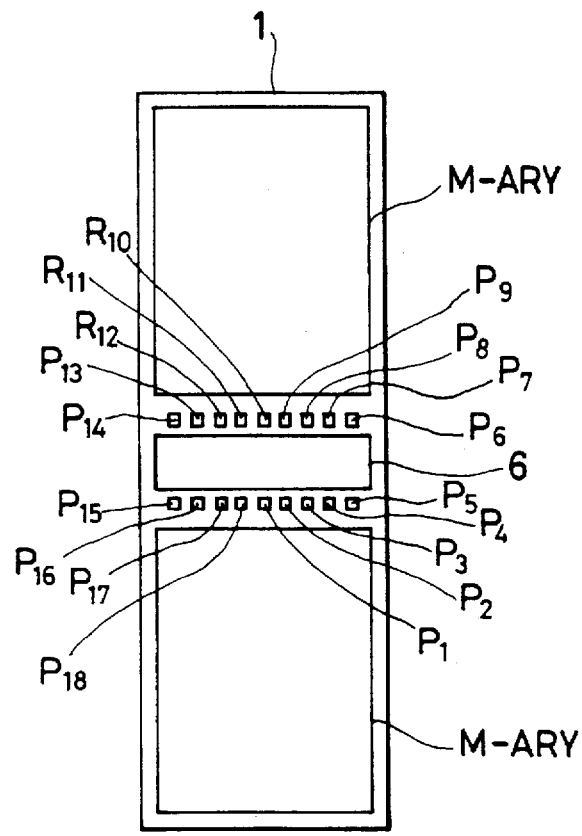
FIG. 5 is a plan view showing a semiconductor chip which is included in the resin-molding DIP package shown in FIG. 1.

As illustrated in FIG. 5, in the semiconductor chip 1, a peripheral circuit region 6 is defined at the central part thereof, and the bonding pads $P_1$-$P_{18}$ are concentratively disposed in a direction along the longer sides of this peripheral circuit region 6 and which direction is substantially parallel to the pair of short sides of the chip. Moreover, symbols M-ARY denote memory cell arrays.

Figure 4:
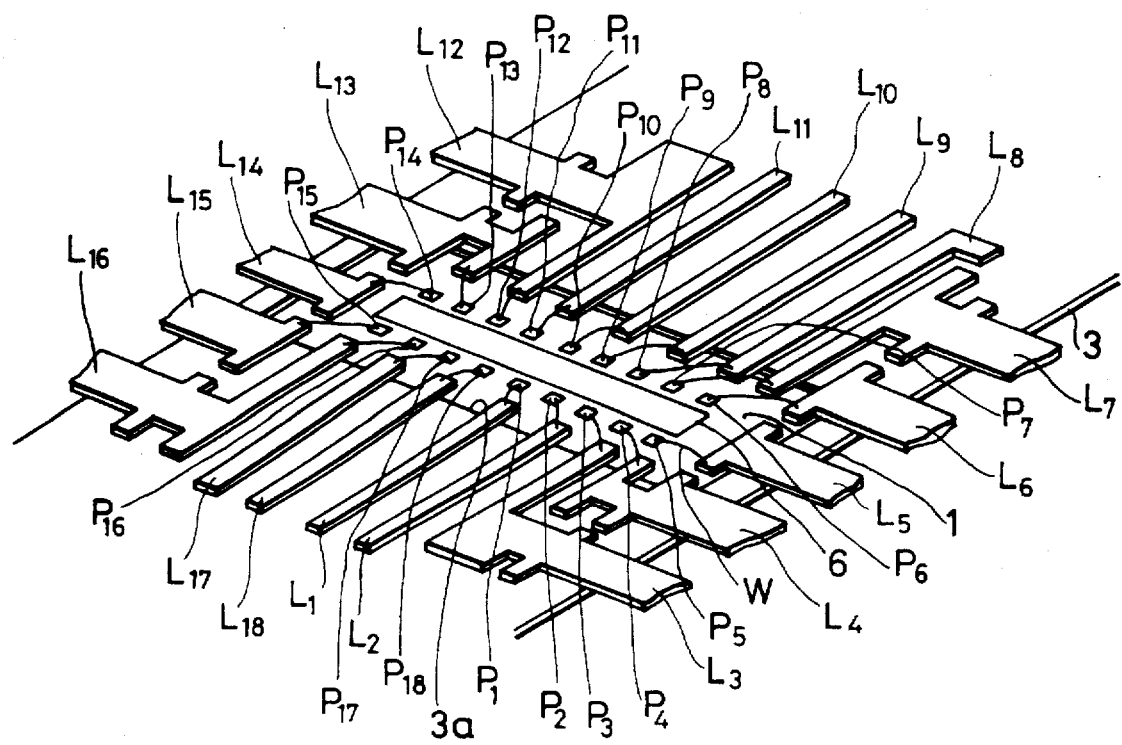
FIG. 4 is a perspective view showing the essential portions of the resin-molding DIP package shown in FIG. 1.

As illustrated in FIGS. 1 and 4, the leads $L_1$-$L_{18}$ are so laid that their fore ends or inner ends adjoin the respective bonding pads $P_1$-$P_{18}$. Thus, the protrusion of the leads out of the semiconductor chip as in the case of the package employing the conventional tabless lead frame, as previously discussed, can be avoided, and the size of the package can therefore be reduced to that extent. For this reason, even when the chip size of the semiconductor chip 1 becomes larger than in case of a dynamic RAM of 1 megabit, it becomes possible to employ a package equal in size to that of the dynamic RAM of 1 megabit. Moreover, since the bonding pads $P_1$-$P_{18}$ are disposed at the central part of the semiconductor chip 1 as stated above, stresses which develop at the boundaries between the semiconductor chip 1 and the resin 2 when this resin reverts to the normal temperature after a resin-molding operation do not become a problem in the vicinity of the bonding pads $P_1$-$P_{18}$. Accordingly, the bonded parts between the wire pieces W and the bonding pads $P_1$-$P_{18}$ or the leads $L_1$-$L_{18}$ can be effectively prevented from breaking because of such stresses. Furthermore, since the peripheral circuits 6 are disposed at the part of the semiconductor chip 1 corresponding to a centrally located area of the first main or front surface thereof, wiring which extends in the direction of the end sides of this semiconductor chip 1 can be made shorter than in the prior art, such as that previously discussed, wherein the peripheral circuits are disposed at both the end parts of the semiconductor chip on the lateral sides thereof. Thus, the delay of a signal attributed to a wiring resistance R and a wiring capacitance C can be prevented, so that the rate of access to a memory cell can be heightened.

Figure 6:
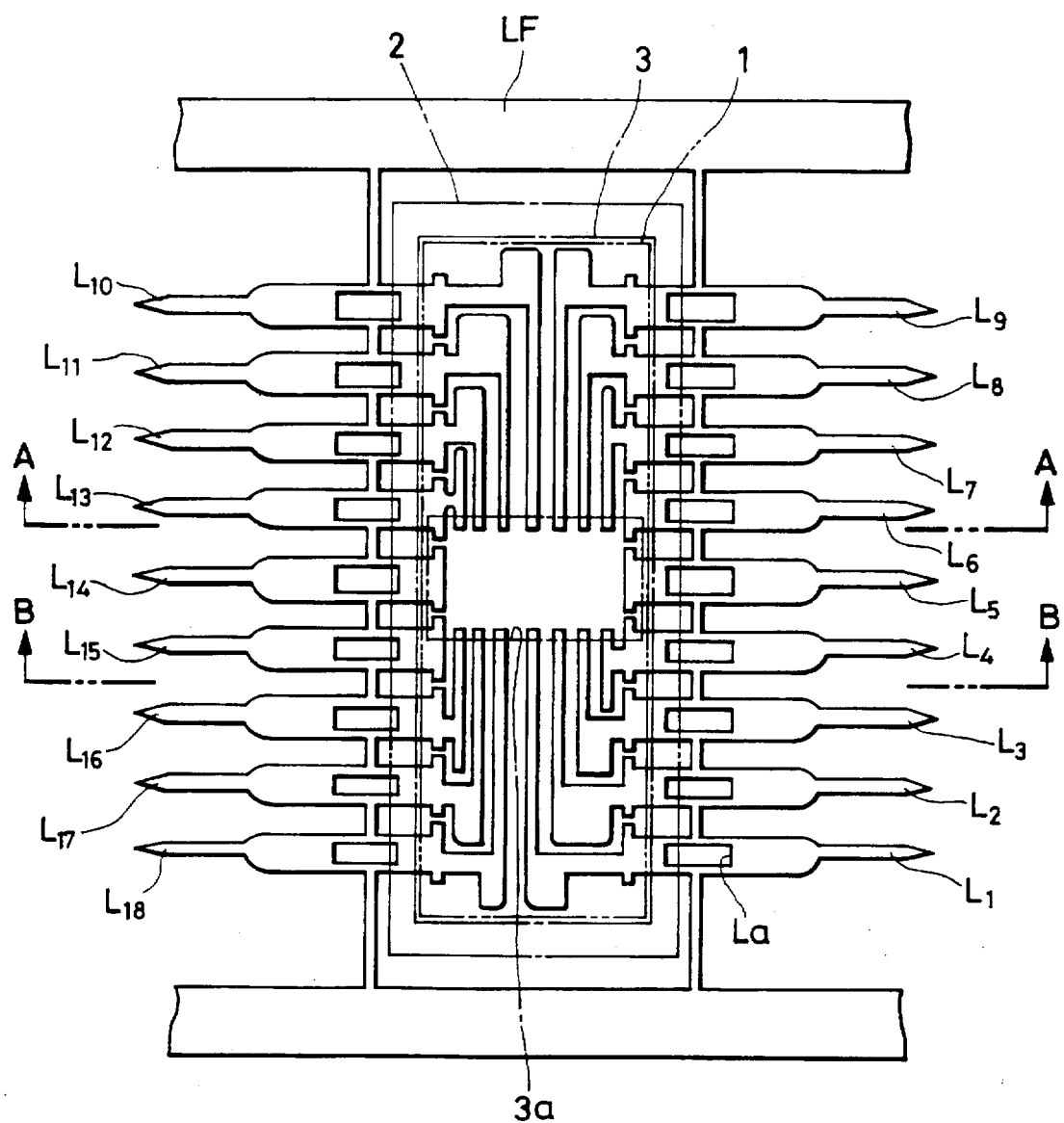
FIG. 6 is a plan view showing a tabless lead frame which is used for manufacturing the resin-molding DIP package shown in FIG. 1.

By the way, as illustrated in FIGS. 1 and 6, each of the leads $L_1$-$L_{18}$ is provided with a slot La in a part or portion thereof corresponding to the border between the resin 2 and the outside space which includes the outer lead portion of the leads. Thus, the area of the boundary between the resin 2 and each of the leads $L_1$-$L_{18}$ becomes small at the border part between the resin 2 and the outside space. Therefore, even when the resin 2 at the border part is thin, this resin 2 can be prevented from undergoing cracks etc. due to a stress which develops at the boundary when the resin reverts to the normal temperature after the resin-molding operation.

Next, there will be described an example of a method of manufacturing the resin-molding DIP package according to the embodiment constructed as stated above.

Figure 7:
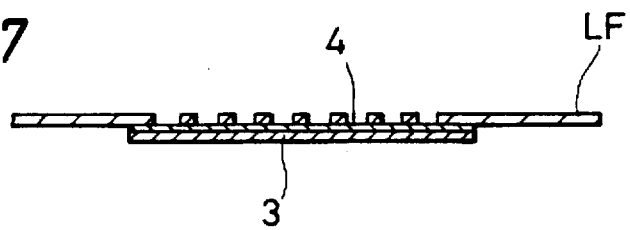
FIGS. 7 thru 9 are sectional views for explaining in the order of steps an example of a method of manufacturing a resin-molding DIP package shown in FIG. 1.

As illustrated in FIG. 7, first of all, a polyimide resin sheet 3 is adhered e.g. bonded, to a tabless lead frame LF by a binder layer 4.

Figure 8:
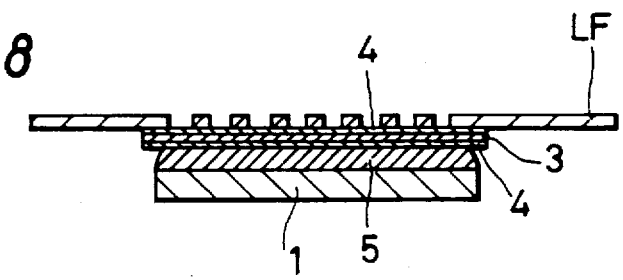

Subsequently, as illustrated in FIG. 8, the polyimide resin sheet 3 and a passivation film 5 on the front surface of a semiconductor chip 1 are adhered by another binder layer 4.

Figure 9:
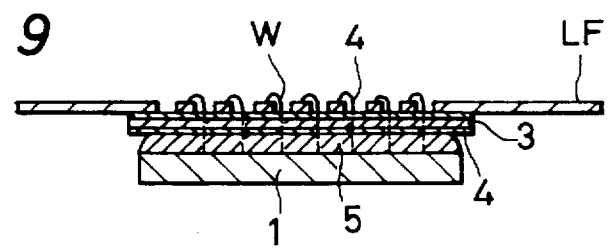

Subsequently, as illustrated in FIG. 9, the bonding pads (not shown) of the semiconductor chip 1 and the leads of the tabless lead frame LF are connected by the bonding of wire pieces W.

Subsequently, the semiconductor chip 1, the wire pieces W, etc. are sealed by resin molding, whereupon the lead frame LF is cut and formed. Then, the intended resin-molding DIP package as shown in FIG. 1 is completed. Here in the example, a molding resin used was a phenol resin-curing cresol novolak epoxy resin (elastomer dispersed system produced by Hitachi Kasei Kabushiki-Kaisha) in which 75 vol.-% of globular quartz filler was compounded and which exhibited a linear expansion coefficient of $1.0 \times 10^{-5}/°C$.

As another example, the polyimide resin sheet 3 can be replaced with a polybiphenyl imide film having a linear expansion coefficient of $1.2 \times 10^{-5}/°C$ and a thickness of 25 μm (produced by Ube Kōsan Kabushiki-Kaisha, trade name: UPILEX S). In this example, a silicone resin-based binder having an elastic modulus of 50 kg-f/mm$^2$ (produced by Toray Silicone Kabushiki-Kaisha) was used for sticking the semiconductor chip and the imide film. Further, a liquid thermosetting epoxy resin (produced by Yuka Shell Kabushiki-Kaisha, trade name: EPICOTE 807/EPIKURE T, elastic modulus: 350 kg-f/mm$^2$) was used for adhering the semiconductor chip with the leads.

As still another example, the DIP package may well have a structure in which the semiconductor chip formed with the passivation film 5 is coated with a polyimide resin (produced by Hitachi Kasei Kabushiki-Kaisha, registered trademark: PIQ) and is further overlaid with the aforementioned liquid thermosetting epoxy resin as a binder, so as to stick the semiconductor chip and the leads.

In each of the preceding two examples, the imide film or the polyimide resin is formed in the state of a semiconductor wafer, a scribe area and the bonding pad portions at the central part of the chip are etched with an etchant of hydrazine, and the semiconductor wafer is subjected to dicing, thereby to prepare the semiconductor chip, whereupon this semiconductor chip is adhered to the leads. In this way, the semiconductor chip and the leads can be positioned with ease.

Although, in the above, the present invention has been specifically described in conjunction with the exemplified embodiment, it is needless to say that the present invention is not restricted to the foregoing embodiment, but that it can be variously altered within a scope not departing from the purport thereof.

For example, the arrangements of the peripheral circuits 6 and the bonding pads $P_1$–$P_{18}$ within the semiconductor chip 1 are not restricted to those in the embodiment described above. By way of example, as shown in FIG. 10, two peripheral circuit regions 6a and 6b may well be provided in opposition to each other at the part of a semiconductor chip 1 corresponding to a centrally located area of the front or first main surface thereof, with bonding pads $P_1$–$P_{18}$ interposed between these peripheral circuit regions 6a and 6b, or as shown in FIG. 11, a peripheral circuit region 6 may well be similarly disposed centrally of a semiconductor chip 1 with bonding pads $P_1$–$P_{18}$ distributed along the longer sides and shorter sides of this peripheral circuit region 6 which is illustrated herein as being rectangular-shaped. Further, as shown in FIG. 12, bonding pads $P_1$–$P_{18}$ may well be aligned centrally chip 1 along the front or first main surface of a semiconductor, such as, illustrated in the direction parallel to the longer end sides thereof.

In addition, the present invention can be applied to various packages other than the DIP package. Further, the present invention is, of course, applicable to a case where the semiconductor chip 1 constitutes any MOS-LSI different from the dynamic RAM, and is also applicable to, for example, a bipolar LSI.

Effects which are attained by typical aspects of performance of the present invention are briefly explained as follows:

The size of a semiconductor device can be reduced. Besides, the bonded parts of bonding pads and wire pieces can be prevented from being broken or disconnected by stresses ascribable to a resin. Further, the delay of a signal attributed to long wiring can be prevented.

In addition, since an organic insulator film exists between a semiconductor chip and leads, the passivation film of the semiconductor chip can be prevented from cracking at the step of wire bonding to the lead side.

What is claimed is:

1. A semiconductor memory device comprising:

a semiconductor chip having a rectangular shaped main surface including a first pair of edges and a second, relatively shorter pair of edges;

a plurality of bonding pads formed on said rectangular shaped main surface of said semiconductor chip and arranged in a direction substantially parallel to the first edges of said rectangular shaped main surface;

first memory cell array regions and second memory cell array regions formed on said rectangular shaped main surface of said semiconductor chip, respectively, said first memory cell array regions being arranged between said plurality of bonding pads and one of said first pair of edges of said rectangular shaped main surface and extending in a direction of the first edges of said rectangular shaped main surface, and said second memory cell array regions being arranged between said plurality of bonding pads and the other of said first pair of edges of said rectangular shaped main surface and extending in a direction of the first edges of said rectangular shaped main surface;

first and second peripheral circuit regions formed on said rectangular shaped main surface of said semiconductor chip, said first peripheral circuit region being arranged between said first memory cell array regions, and said second peripheral circuit region being arranged between said second memory cell array regions;

a plurality of leads formed over said rectangular shaped main surface of said semiconductor chip, each of said plurality of leads being extended in an outwardly direction via one of said first pair of edges of said rectangular shaped main surface, and said plurality of leads being electrically connected with said plurality of bonding pads; and a resin sealing said semiconductor chip.

2. A semiconductor memory device according to claim 1, further comprising an insulating film, wherein said insulating film is interposed between said rectangular shaped main surface of said semiconductor chip and a portion of each one of said plurality of leads.

3. A semiconductor memory device according to claim 2, wherein said insulating film is an organic insulating film and is adhered to a passivation film formed on said rectangular shaped main surface of said semiconductor chip.

4. A semiconductor memory device according to claim 3, wherein said first memory cell array regions include first and second spaced-apart and rectangular shaped memory cell arrays, and wherein said second memory cell array regions include third and fourth spaced-apart and rectangular shaped memory cell arrays, the first through fourth memory cell arrays are elongated in the direction of the first edges of said rectangular shaped main surface.

5. A semiconductor memory device according to claim 1, wherein said first memory cell array regions include first and second spaced-apart and rectangular shaped memory cell arrays, and wherein said second memory cell array regions include third and fourth spaced-apart and rectangular shaped memory cell arrays, the first through fourth memory cell arrays are elongated in the direction of the first edges of said rectangular shaped main surface.

6. A semiconductor memory device according to claim 5, wherein said plurality of bonding pads are centrally disposed on said rectangular shaped main surface and are arrayed in a substantially straight line extending in the direction of the first edges of said rectangular shaped main surface.

7. A semiconductor memory device according to claim 4, wherein said plurality of bonding pads are centrally disposed on said rectangular shaped main surface and are arrayed in a substantially straight line extending in the direction of the first edges of said rectangular shaped main surface.

8. A semiconductor memory device according to claim 1, wherein said plurality of bonding pads are centrally disposed on said rectangular shaped main surface and are arrayed in a substantially straight line extending in the direction of the first edges of said rectangular shaped main surface.

9. A semiconductor memory device according to claim 1, wherein all of said plurality of bonding pads are arranged to form a distribution pattern of bonding pads in the direction substantially parallel to the first edges of said rectangular shaped main surface.

10. A semiconductor memory device comprising:
a semiconductor chip having a rectangular shaped main surface including a first pair of edges and a second, relatively shorter pair of edges;
a plurality of bonding pads formed on said rectangular shaped main surface of said semiconductor chip and arranged in a direction substantially parallel to the first edges of said rectangular shaped main surface;
first and second peripheral circuit regions formed on said rectangular shaped main surface of said semiconductor chip, said first peripheral circuit region being arranged between said plurality of bonding pads and one of said first pair of edges of said rectangular shaped main surface, and said second peripheral circuit region being arranged between said plurality of bonding pads and the other of said first pair of edges of said rectangular shaped main surface;
first memory cell array regions and second memory cell array regions formed on said rectangular shaped main surface of said semiconductor substrate, respectively, said first memory cell array regions being arranged between said plurality of bonding pads and said one of said first pair of edges of said rectangular shaped main surface and arranged at both sides of said first peripheral circuit region and extending in the direction substantially parallel to said first pair of edges of said rectangular shaped main surface, and said second memory cell array regions being arranged between said plurality of bonding pads and said other of said first pair of edges of said rectangular shaped main surface and arranged at both sides of said second peripheral circuit region and extending in the direction substantially parallel to said first pair of edges of said rectangular shaped main surface;
a resin sealing said semiconductor chip; and
a plurality of leads formed over said rectangular shaped main surface of said semiconductor chip, each of said plurality of leads having an inner lead portion sealed in said resin and an outer lead portion extending outwardly from said resin, said plurality of leads being electrically connected with said plurality of bonding pads.

11. A semiconductor memory device according to claim 10, wherein said plurality of leads are extended in an outwardly direction via the first edges of said rectangular shaped main surface of said semiconductor chip.

12. A semiconductor memory device according to claim 10, further comprising an insulating film, wherein said insulating film is interposed between said rectangular shaped main surface of said semiconductor chip and a portion of each one of said plurality of leads.

13. A semiconductor memory device according to claim 12, wherein said insulating film is an organic insulating film and is adhered to a passivation film formed on said rectangular shaped main surface of said semiconductor chip.

14. A semiconductor memory device according to claim 13, wherein said plurality of leads are extended in an outwardly direction via the first edges of said rectangular shaped main surface of said semiconductor chip.

15. A semiconductor memory device according to claim 14, wherein said first memory cell array regions include first and second spaced-apart and rectangular shaped memory cell arrays, and wherein said second memory cell array regions include third and fourth spaced-apart and rectangular shaped memory cell arrays, the first through fourth memory cell arrays are elongated in the direction of the first edges of said rectangular shaped main surface.

16. A semiconductor memory device according to claim 13, wherein said first memory cell array regions include first and second spaced-apart and rectangular shaped memory cell arrays, and wherein said second memory cell array regions include third and fourth spaced-apart and rectangular shaped memory cell arrays, the first through fourth memory cell arrays are elongated in the direction of the first edges of said rectangular shaped main surface.

17. A semiconductor memory device according to claim 10, wherein said first memory cell array regions include first and second spaced-apart and rectangular shaped memory cell arrays, and wherein said second memory cell array regions include third and fourth spaced-apart and rectangular shaped memory cell arrays, the first through fourth memory cell arrays are elongated in the direction of the first edges of said rectangular shaped main surface.

18. A semiconductor memory device according to claim 10, wherein all of said plurality of bonding pads are arranged to form a distribution pattern of bonding pads in the direction substantially parallel to the first edges of said rectangular shaped main surface.

19. A semiconductor memory device comprising:
a semiconductor chip having a rectangular shaped main surface including a first pair of edges and a second, relatively shorter pair of pair of edges;
a plurality of bonding pads formed on said rectangular shaped main surface of said semiconductor chip and arranged in a direction substantially parallel to the first edges of said rectangular shaped main surface;
first memory cell array regions and second memory cell array regions formed on said rectangular shaped main surface of said semiconductor chip, respectively, said first memory cell array regions being arranged between said plurality of bonding pads and one of said first pair of edges of said rectangular shaped main surface and along said one of said first pair of edges such that there is effected a first gap between said first memory cell array regions in a direction of said first pair of edges, and said second memory cell array regions being arranged between said plurality of bonding pads and the other of said first pair of edges of said rectangular shaped main surface and along said other of said first pair of edges such that there is effected a second gap between said second memory cell array regions in the direction of said pair of first edges;

first and second peripheral circuit regions formed on said rectangular shaped main surface of said semiconductor chip, said first peripheral circuit region being arranged in said first gap between said first memory cell array regions, and said second peripheral circuit region being arranged in said second gap between said second memory cell array regions;

a plurality of leads formed over said rectangular shaped main surface of said semiconductor chip, said plurality of leads being electrically connected with said plurality of bonding pads; and a resin sealing said semiconductor chip.

20. A semiconductor memory device according to claim 19, wherein all of said plurality of bonding pads are arranged to form a distribution pattern of bonding pads in the direction substantially parallel to the first edges of said rectangular shaped main surface.

21. A semiconductor memory device according to claim 19, wherein said first memory cell array regions include first and second rectangular shaped memory cell arrays and said second memory cell array regions include third and fourth rectangular shaped memory cell arrays, the first and second memory cell arrays being elongated and separated from each other via said first gap, and the third and fourth memory cell arrays being elongated and separated from each other via said second gap.

22. A semiconductor memory device according to claim 21, wherein said plurality of bonding pads are centrally disposed on said rectangular shaped main surface and are arrayed in a substantially straight line extending in the direction of the first edges of said rectangular shaped main surface.

23. A semiconductor memory device according to claim 22, further comprising an insulating film, wherein said insulating film is interposed between said rectangular shaped main surface of said semiconductor chip and a portion of each one of said plurality of leads.

24. A semiconductor memory device according to claim 23, wherein said insulating film is an organic insulating film and is adhered to a passivation film formed on said rectangular shaped main surface of said semiconductor chip.

25. A semiconductor memory device according to claim 19, wherein said plurality of bonding pads are centrally disposed on said rectangular shaped main surface and are arrayed in a substantially straight line extending in the direction of the first edges of said rectangular shaped main surface.

* * * * *